(12) United States Patent
Nozawa et al.

(10) Patent No.: US 7,468,687 B2
(45) Date of Patent: Dec. 23, 2008

(54) SIGNAL PROCESSING DEVICE AND SIGNAL PROCESSING METHOD

(75) Inventors: Kazuhiro Nozawa, Kanagawa (JP); Endrianto Djajadi, Kanagawa (JP)

(73) Assignee: Sony Corporation (JP)

( * ) Notice: Subject to any disclaimer, the term of this patent is extended or adjusted under 35 U.S.C. 154(b) by 438 days.

(21) Appl. No.: 10/567,350

(22) PCT Filed: Jun. 22, 2005

(86) PCT No.: PCT/JP2005/011879

§ 371 (c)(1),
(2), (4) Date: Feb. 6, 2006

(87) PCT Pub. No.: WO2006/001466

PCT Pub. Date: Jan. 5, 2006

(65) Prior Publication Data

US 2008/0150775 A1    Jun. 26, 2008

(30) Foreign Application Priority Data

Jun. 24, 2004    (JP)  ............................. 2004-186145

(51) Int. Cl.
*H03M 1/66* (2006.01)
(52) U.S. Cl. ................. 341/144; 341/155; 341/118; 341/120
(58) Field of Classification Search ............ 341/118, 341/120, 141, 144, 155
See application file for complete search history.

(56) References Cited

U.S. PATENT DOCUMENTS 4,430,642 A * 2/1984 Weigand et al. ............. 341/141

(Continued)

FOREIGN PATENT DOCUMENTS

JP    04-219023 A    8/1992

(Continued)

OTHER PUBLICATIONS

English Translation of Preliminary Report on Patentability dated Jan. 11, 2007 for International Application No. PCT/JP2005/011879.

(Continued)

*Primary Examiner*—Jean B Jeanglaude
(74) *Attorney, Agent, or Firm*—Rader Fishman & Grauer PLLC; Ronald P. Kananen

(57) ABSTRACT

A problem is overcome in that when a signal is input and output in an analog signal format between two blocks for executing digital signal processing, a dynamic range is made improper by the dispersion of errors of the signal levels in a D/A converter and an A/D converter in the blocks. A gain is set such that the minimum value within the range of dispersion of errors of the signal level of a D/A converter 12 of a DSP 1 in a former stage is made larger than the maximum value within the range of dispersion of errors of the signal level of an A/D converter 21 in a latter stage. Then, the gain value of a second GCA 13 is set such that the level of a signal S5 is set to a maximum value within the range less than a prescribed value Vdr in a state that a signal having a level treated as a predetermined maximum value in the DSP 1 is input to the first GCA 13. Next, a gain value is set to a second GCA 24 such that the level of the signal S5 is set to a maximum value within the range equal to or less than the prescribed value.

3 Claims, 8 Drawing Sheets

U.S. PATENT DOCUMENTS

| | | | |
|---|---|---|---|
| 4,947,168 A * | 8/1990 | Myers | 341/120 |
| 5,812,077 A * | 9/1998 | Boie | 341/118 |
| 5,887,244 A * | 3/1999 | Aldridge et al. | 455/67.14 |
| 6,518,902 B2 * | 2/2003 | Panasik et al. | 341/141 |
| 6,667,703 B1 * | 12/2003 | Reuveni et al. | 341/120 |
| 2003/0006926 A1 | 1/2003 | Nikai et al. | |

FOREIGN PATENT DOCUMENTS

| | | |
|---|---|---|
| JP | 08-181886 A | 7/1996 |
| JP | 09-245433 A | 9/1997 |
| JP | 10-336547 | 12/1998 |
| JP | 2000-316087 A | 11/2000 |
| JP | 2003-188727 A | 7/2003 |
| JP | 2003-271103 A | 9/2003 |

OTHER PUBLICATIONS

PCT International Search Report for PCT/JP2005/011879 mailed on Aug. 16, 2005.

* cited by examiner

SIGNAL PROCESSING DEVICE AND SIGNAL PROCESSING METHOD

TECHNICAL FIELD

The present invention relates to a signal processing device and a signal processing method that mainly set a gain for, for example, a video signal, and the like.

BACKGROUND ART

In the field of equipment including an image display apparatus that requires video signal processing, the video signal processing is generally executed by digital signal processing due to widespread use of chips and devices called DSPs (digital signal processors).

FIG. 6 shows an arrangement of an image display apparatus having an LCD (liquid crystal display) as a display device as an example of equipment for executing video signal processing by the DSP provided therewith.

A DSP 1 shown in the figure is composed of, for example, one chip or one device and executes necessary signal processing to an input digital video signal by a signal processing unit 11 formed in the chip or the device. The signal processing executed here is digital signal processing. The DSP 1 outputs the digital video signal, which is subjected to the signal processing by the signal processing unit 11, to the outside from a terminal T1 after it is converted into an analog video signal by a D/A converter 12.

In this case, the terminal T1 of the DSP 1 is connected to a terminal T4 of an LCD drive circuit 2 composed of one device likewise, for example, the DSP 1, thereby the analog video signal output from the terminal T1 of the DSP 1 is input to the LCD drive circuit 2 through the terminal T4.

The LCD drive circuit 2 creates a drive signal for driving an LCD 3 for display based on the analog video signal input thereto and outputs the drive signal from a terminal T5. In this case, the terminal T5 is connected to a terminal T6 of the LCD 3 as a display device, and the drive signal is input to the LCD 3 from the terminal T6.

The LCD 3 drives a pixel cell in response to the drive signal input thereto. With this operation, the LCD 3 displays an image according to the video signal.

Incidentally, it is assumed that the image display apparatus arranged as shown in, for example, FIG. 6 must be modified so that a novel video signal processing function can be added thereto. It is first contemplated to remake the DSP 1 to cope with the modification. However, remaking it takes a cost such as development cost, a manufacturing cost, and the like. Accordingly, when the modification is not executed on a large scale, there is a disadvantage in that an effect such as an appeal to users and the like obtained by the modification does not worth the cost increased by remaking the DSP 1.

In this case, there is employed a method of mounting an external circuit (chip, device) that corresponds to the novel video signal processing function. Further, when the external circuit is composed of an analog circuit for executing analog video signal processing, a disadvantage arises in that a circuit size is increased and dispersion and the like of a signal level are also increased. Thus, it is preferable to arrange the external circuit so as to execute digital signal processing.

FIG. 7 shows an image display apparatus on which mounted is an external circuit (chip, device) arranged to execute the digital signal processing as described in the latter method. Note that, in FIG. 7, the same portions as those in FIG. 6 are denoted by the same reference numerals, and the explanation thereof is omitted.

In the image display apparatus shown in the figure, a signal processing block 4 as an external digital signal processing circuit (chip, device) is interposed between a DSP 1 and an LCD drive circuit 2.

Since a terminal T2 of the signal processing block 4 is connected to a terminal T1 of the DSP 1, an analog video signal is input to the terminal T2 after it is subjected to signal processing by the DSP 1.

As an internal arrangement of the signal processing block 4, first, the analog video signal input through the terminal T2 as described above is converted into a digital video signal by an A/D converter 21 so that it can be subjected to digital signal processing internally. Then, video signal processing corresponding to a specific function is executed by the digital signal processing executed by a signal processing unit 22. Then, the digital video signal, which is subjected to the signal processing as described above, is converted into an analog video signal by a D/A converter 23 so that it can be input to an LCD drive circuit 2 and then output from a terminal T3. The terminal T3 is connected to a terminal T4 of the LCD drive circuit 2, thereby the analog video signal is input to the LCD drive circuit 2 (refer to Japanese Unexamined Patent Application Publication No. 10-336547).

Incidentally, the signal processing block 4 in the image display apparatus shown in FIG. 7 includes cells of the A/D converter 21 and the D/A converter 23 so that it cope with an input/output of the analog video signal while executing the video signal processing therein by the digital signal processing. Further, in the image display apparatus shown in FIG. 7, a cell of a D/A converter 12 is also included in the DSP 1. Accordingly, a system of the image display apparatus shown in FIG. 7 has the cells of three sets of the A/D converters and D/A converters in its entirety.

As an actual matter, it is known that the cells of the A/D converters and the D/A converters of these devices have dispersion (error) in input/output signal levels (data values in a digital signal).

Dispersion of the cells of the A/D converters and the D/A converters is guaranteed so that it is within a predetermined range. However, when the number of the cells of the A/D converters and the D/A converters connected to each other in series increases as shown in FIG. 7, an error of an overall data value (signal level) increases. When the error increases as described above, an original dynamic range cannot be effectively utilized because, for example, a data value (level) tends to overflow (excessively input) or a signal level is made too small.

What has been described above will be explained with reference to FIGS. 8A, B, and C.

First, FIG. 8A shows a case in which the dynamic range (maximum output level) of the D/A converter 12 in the DSP 1 is the same as the dynamic range (maximum input level) of the A/D converter 21 of the signal processing block 4.

The data value of an input signal S1 (output from a signal processing unit 11 in FIG. 7) of the D/A converter 12 is set to a level Ldr that corresponds to the dynamic range DR of the A/D converter 21. Then, a signal S2, which is obtained by converting the input signal S1 into an analog signal by the D/A converter 12, has the level Ldr because the dynamic range of the D/A converter 12 is the same as that of the A/D converter 21.

That is, this case is in such a state that an ideal dynamic range is secured in which an input signal having a maximum value is kept as it is without overflowing.

In contrast, FIG. 8B shows a case in which the dynamic range (maximum output level) of the D/A converter 12 in the DSP 1 is larger than the dynamic range (maximum input level) of the A/D converter 21 of the signal processing block 4 as a relation to the dispersion of error.

In this case, since the D/A converter 12 has the larger dynamic range, the signal S2, which is obtained by converting the input signal S1 having the level Ldr into the analog signal, is output in a level La higher than the level Ldr as shown in the figure.

In this case, even if the signal S2 is input to the A/D converter 21, since the level of the signal S2 exceeds the dynamic range of the A/D converter 21, the data value of a signal output from the A/D converter 21 overflows.

Further, FIG. 8C shows a case in which the dynamic range (maximum output level) of the D/A converter 12 in the DSP 1 is smaller than the dynamic range (maximum input level) of the A/D converter 21 of the signal processing block 4 as a relation to the dispersion of error.

In this case, since the D/A converter 12 has the smaller dynamic range, the signal S2, which is obtained by converting the input signal S1 having the level Ldr into the analog signal, is output in a level Lb smaller than the level Ldr.

The signal S2 has a small level in correspondence with a difference of levels Ldr-Lb with respect to the dynamic range of the D/A converter 12 regardless that the level of the signal S2 must be originally Ldr. That is, the dynamic range cannot be sufficiently secured.

As described above, the dispersion of error of the cells of the D/A converters and the A/D converters appears in a state that the dynamic range is made improper as described above, this state appears as a phenomenon, for example, deterioration of solarization.

DISCLOSURE OF THE INVENTION

Accordingly, a signal processing device of the present invention is arranged as described below in consideration of the problems described above.

A signal processing device according to the present invention comprises a first digital signal processing block and a second digital signal processing block.

The first digital signal processing block comprises a first gain adjustment means to which a digital signal subjected to predetermined digital signal processing is input and from which the digital signal is output after a gain according to a set gain value is given to the digital signal and a first digital to analog conversion means for converting the digital signal output from the first gain adjustment means to an analog signal and outputting the analog signal from the first digital signal processing block.

The second digital signal processing block comprises an analog to digital conversion means for converting the analog signal output from the digital to analog conversion means of the first digital signal processing block to a digital signal, a digital signal processing means for subjecting the digital signal output from the analog to digital conversion means to predetermined digital signal processing, a second gain adjustment means to which the digital signal output from the digital signal processing means is input, from which the digital signal is output after a gain according to a set gain value is given to the signal, and to which gain sensitivity lower than that of the first gain adjustment means is set, and a second digital to analog conversion means for converting the digital signal output from the second gain adjustment means to an analog signal and outputting the analog signal from the second digital signal processing block.

In the above arrangement, the first digital to analog conversion means and the analog to digital conversion means are set such that a relation, in which the minimum value within the range of dispersion of the errors of the signal level in the first digital to analog conversion means is equal to or larger than the maximum value within the range of dispersion of the errors of the signal level in the analog to digital conversion means.

Further, the signal processing device comprises a detection means for detecting the level value of the digital signal output from the second gain adjustment means, a first gain set means for setting a gain value to the first gain adjustment means such that the level value detected by the detection means is set to a maximum value within the range less the a prescribed value in a state that a signal whose level is treated as a maximum value in the first digital signal processing block is input to the first gain adjustment means, and a second gain set means for setting a gain value to the second gain adjustment means such that the level value detected by the detection means is set to a maximum value within the range equal to or less than the prescribed value in a state that a signal whose level is treated as a predetermined maximum value is input to the first digital signal processing block after the gain value is set by the first gain set means.

Further, a signal processing method is arranged as described below.

First, the signal processing method of the present invention executes first digital signal processing and second digital signal processing.

The first digital signal processing comprises a first gain adjustment procedure to which a digital signal subjected to predetermined digital signal processing is input and which gives a gain according to a set gain value and a first digital to analog conversion procedure for converting the digital signal obtained by the first gain adjustment procedure to an analog signal and using the analog signal as an output from the first digital signal processing.

The second digital signal processing comprises an analog to digital conversion procedure for converting the analog signal obtained by the digital to analog conversion procedure included in the first digital signal processing into a digital signal, a digital signal processing procedure for subjecting the digital signal obtained by the analog to digital conversion procedure to predetermined digital signal processing, a second gain adjustment procedure to which the digital signal obtained by the digital signal processing procedure is input and which gives a gain by gain sensitivity lower than the first gain adjustment procedure according to a set gain value, and a second digital to analog conversion procedure for converting the digital signal obtained by the first gain adjustment procedure to an analog signal and outputting the analog signal from the second digital signal processing unit.

The signal processing method further executes a set procedure for setting such a relation that the minimum value within the range of dispersion of the errors of the signal level in a device corresponding to the first digital to analog conversion procedure is equal to or larger than the maximum value within the range of dispersion of the errors of the signal level in a device corresponding to the analog to digital conversion procedure, a detection procedure for detecting the level value of the digital signal obtained by the second gain adjustment procedure, a first gain set procedure for setting a gain value to the first gain adjustment procedure such that the level value detected by the detection procedure is set to a maximum value within the range less the a prescribed value in a state that a signal whose level is treated as a maximum value in the first digital signal processing is input to the first gain adjustment procedure, and a second gain set means for setting a gain value to the second gain adjustment procedure such that the level value detected by the detection procedure is set to a maximum value within the range equal to or less than the prescribed value in a state that a signal whose level is treated as a predetermined maximum value is input to the first digital signal processing block after the gain value is set by the first gain set procedure.

In the above respective arrangements, a digital signal processing system is constructed by the first digital signal processing block (first digital signal processing) connected in series to the second digital signal processing block (second digital signal processing) as well as an analog signal is transmitted therebetween as can be found from that the D/A conversion function and the A/D conversion function are interposed between both the blocks.

When a gain is to be set in the arrangement as described above, first, the minimum value within the range of dispersion of the errors of the signal level of the D/A conversion function (first digital to analog conversion means/procedure) on the first digital signal processing block side is set larger than the maximum value within the range of dispersion of the errors of the signal level of the A/D conversion function on the second digital signal processing block side. As a result, it can be securely prevented that an input from the D/A conversion function on the first digital signal processing block to the A/D conversion function on the second digital signal processing block falls short of a range.

Further, first, a gain value is set to the first gain adjustment means/procedure such that the level value detected by the detection means/procedure is set to the maximum value within the range less than the prescribed value in the state that the signal whose level is treated as the predetermined maximum value is input to the first gain adjustment means/procedure. After the gain value is set to the first gain adjustment means/procedure as described above, a gain value is set to the second gain adjustment means/procedure such that the level value detected by the detection means/procedure is set to a maximum value within the range equal to or less than the prescribed value in the state that the signal whose level is treated as the predetermined maximum value is input to the first digital signal processing block likewise.

Here, the gains are set to the first and second gain adjustment means/procedures based on the level value of the digital signal whose gain is set by the first and second gain adjustment means/procedures. With this operation, in the state that the gains are set as described above, a dynamic range as large as possible can be obtained regardless of the dispersion of the errors of the signal levels in the D/A conversion function on the first digital signal processing block and in the A/D conversion function on the second digital signal processing block.

BEST MODE FOR CARRYING OUT THE INVENTION

Figure 1:
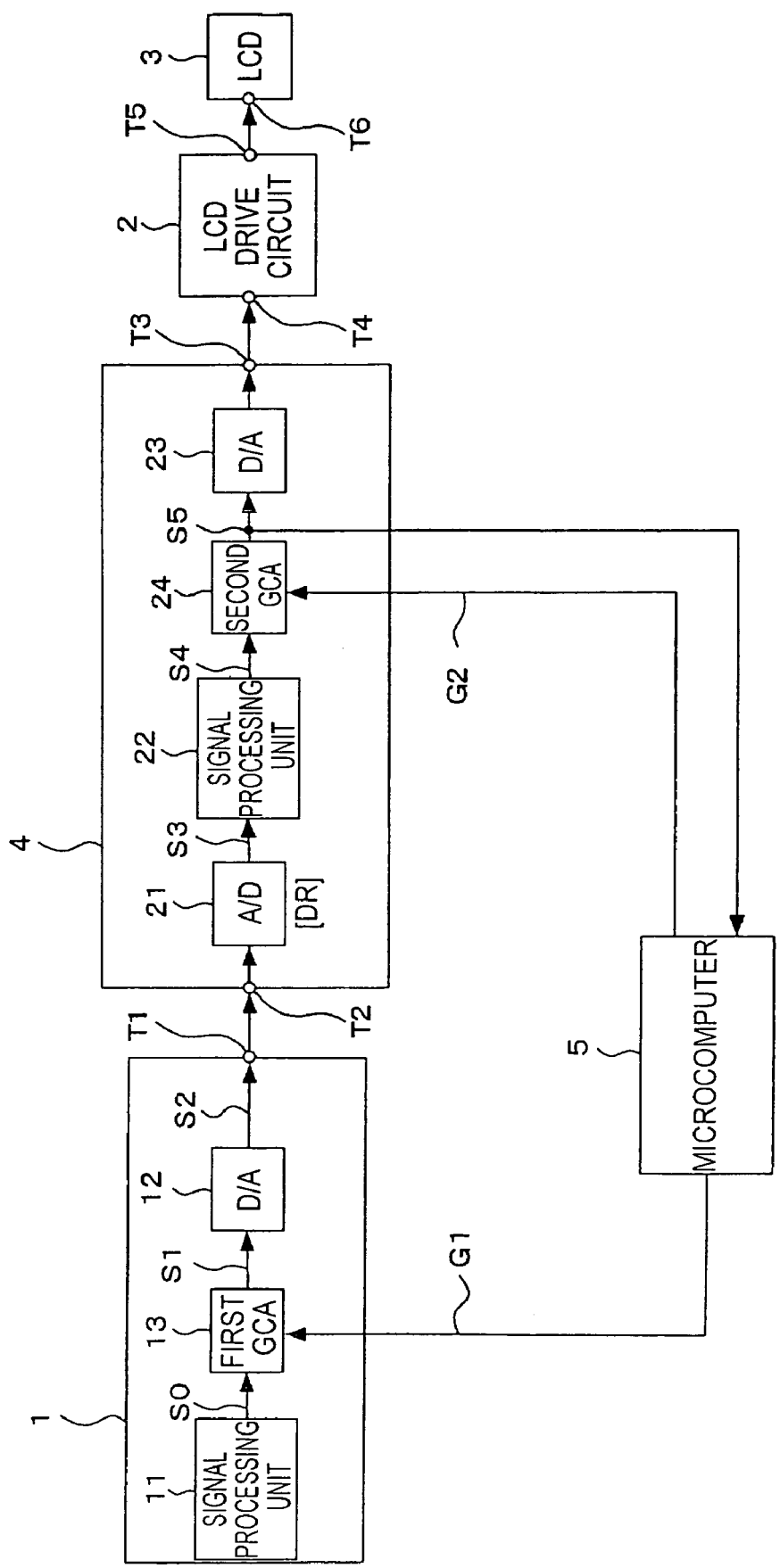
FIG. 1 is a block diagram showing a configuration example of an image display apparatus as an embodiment of the present invention.

FIG. 1 shows an image display apparatus as an embodiment of the present invention. The image display apparatus includes an arrangement as a signal processing device based on the present invention. Although the embodiment is explained by exemplifying first and second embodiments that have a different gain setting procedure, the arrangement shown in FIG. 1 is common to the first and second embodiments.

A signal processing system of the image display apparatus shown in the figure includes a DSP 1, a signal processing block 4, an LCD drive circuit 2, and an LCD 3 when they are broadly classified.

The DSP 1, the signal processing block 4, the LCD drive circuit 2, and the LCD 3 are mounted as independent chips or devices, respectively. In the above arrangement, the DSP 1 is connected to the signal processing block 4 through terminals T1 and T2, the signal processing block 4 is connected to the LCD drive circuit 2 through terminals T3 and T4, and the LCD drive circuit 2 is connected to the LCD 3 through terminals T5 and T6.

In this case, the interior of the DSP 1 is composed of a signal processing unit 11, a first GCA 13 (gain control amplifier), and a D/A converter 12. The signal processing unit 11 outputs a signal S0 (in a format of a digital video signal), which is obtained by subjecting a digital video signal input to display an image to various required digital signal processing to the first GCA 13. The first GCA 13 sets a gain value G1 indicated by a control signal output from a microcomputer 5, makes the gain of the input digital video signal (S0) variable, and outputs it as a signal S1. Note that since the first GCA 13 is used to adjust the gain of a digital signal, it can be composed of a multiplier and the like used to, for example, adjust a digital value.

The signal S1 output from the first GCA 13 is input to the D/A converter 12 and converted into a signal S2 as an analog video signal which is output to the terminal T1. The signal S2 output to the terminal T1 is input to the terminal T2 of the signal processing block 4.

The image display apparatus shown in FIG. 1 was previously composed of, for example, a DSP 1, an LCD 2, and an LCD 3. That is, it was composed by omitting the signal processing block 4. In this arrangement, a terminal T1 of the DSP 1 was connected to a terminal T4 of the LCD drive circuit 2, thereby a signal S2 as an analog video signal output from the DSP 1 was input to the LCD drive circuit 2 as it was. A reason why the DSP 1 was arranged to output the analog video signal was based on the condition that the output from the DSP 1 was input to the LCD drive circuit 2.

The signal processing block 4 of the embodiment is a chip or a device as an external circuit additionally mounted to provide the previous image display apparatus with a novel predetermined signal processing function. That is, the signal processing block 4 is arranged to execute signal processing for realizing the novel predetermined signal processing function.

When it is intended to provide the previous image processing apparatus with the novel predetermined signal processing function, it is contemplated to redesign and manufacture the DSP 1 itself. However, this requires costs for developing and manufacturing it again.

For example, when addition of the novel signal processing function is a small scale of modification in an overall system of the image display apparatus, an effect resulting from the addition of the signal processing function may fail to match the costs of manufacturing and mounting the DSP 1 again and may be disadvantageous in cost. In this case, it is advantageous to additionally provide an external circuit having the novel signal processing function with the previous arrangement. The embodiment is applied to this case, and the signal processing block 4 is additionally mounted on the arrangement of the previous image display apparatus.

When the external circuit is composed of an analog circuit for executing the video signal processing, a disadvantage arises in that a circuit size and dispersion of a signal level increase. Accordingly, it is also preferable to arrange the external circuit to execute the digital signal processing. From the point of view described above, the signal processing block 4 is also arranged to execute the digital signal processing. That is, the signal processing block 4 is also arranged as a single chip or a single device.

Although the signal processing block 4 executes the digital signal processing as described above, the video signal (S2) input from the terminal T1 of the DSP 1 is an analog format signal. The signal processing block 4 reconverts the analog video signal (S2) input from the terminal T2 into a digital video signal (S3) by the A/D converter 21 and inputs it to a signal processing unit 22.

The signal processing unit 22 subjects the digital video signal (S3) input thereto to digital signal processing that corresponds to at least the novel signal processing function and outputs it as a signal S4. The signal S4 is input to a second GCA 24.

The second GCA 24 gives a gain, which is set according to a gain value G2 indicated by the microcomputer 5, to the digital video signal (S4) input thereto likewise the first GCA 13 explained above and outputs it as a signal S5. Note that the second GCA 24 can be also composed of a multiplier and the like. However, in order to set the gains by the first GCA 13 and the second GCA 24 in a manner described below, the first GCA 13 has a gain sensitivity larger than that of the second GCA 24.

The digital video signal (S5) output from the second GCA 24 is input to the D/A converter 23. The digital video signal (S5) is branched and input also to the microcomputer 5.

When the LCD drive circuit 2 receives the video signal output from the signal processing block 4, an analog signal is input to the LCD drive circuit 2. Thus, in the signal processing block 4, the D/A converter 23 converts the digital video signal (S5) input thereto into the analog video signal and inputs it to the terminal T4 of the LCD 2 through the terminal T3.

The LCD drive circuit 2 creates a drive signal for driving the LCD 3 for display based on the analog video signal input thereto and inputs it to the terminal T6 of the LCD 3 through the terminal T5.

The LCD 3 drives pixel cells in response to the drive signal input thereto. With this operation, the LCD 3 displays an image according to the video signal.

The microcomputer 5 is composed of a CPU (central processing unit), ROM, RAM, and the like, and the image display apparatus is controlled in, for example, such a manner that the CPU executes a program installed on and stored in the ROM.

In the embodiment, the microcomputer 5 adjusts gains of the first GCA 13 and the second GCA 24 as described below.

In the image display apparatus arranged as shown in FIG. 1, the cells of the three sets of the D/A converters and A/D converters are disposed in series in a signal processing system. The errors of the signal input levels of the cells of the D/A converters or A/D converters are dispersed with respect to a rated level.

More specifically, as to an input, an error occurs in such a manner that even if "A" is set as a maximum allowable level (data value) determined in a specification, actually, a level larger than "A" (data value) can be input, a level (data value) smaller than "A" is set as an actual maximum allowable level, or when "A" is input actually, a level is exceeded (overflows). Further, as to an output, an error occurs in such a manner that even if a maximum output level (data value), which responds to a maximum level input signal, is set to "B" in the specification, an output is actually made in a level larger or smaller than the level B. Further, an amount of error of the input/output levels is dispersed in the respective cells.

It is as described above that the dynamic range of the video signal is made improper by the errors and the dispersion thereof.

In the embodiment, the first and second GCAs 13 and 24 are provided and further the gains thereof are set such that the dynamic range of the video signal is made proper regardless that the cells of the D/A converters and the A/D converters disperse.

Note that the gains are set at, for example, an adjustment step of a manufacturing process, and, fundamentally, when the gains are set once, gain values at the time are fixedly set thereafter. However, a timing at which the microcomputer 5 sets the gains is not particularly limited, and, for example, it may be set every time a power supply is set up, at every predetermined number of times the power supply is set up, or at every predetermined intervals. When the gains are set in a chance at a predetermined frequency after shipment from a factory, the change of dispersion of signal levels that is caused by, for example, deterioration with age and any other reasons can be coped with.

Figure 2A:
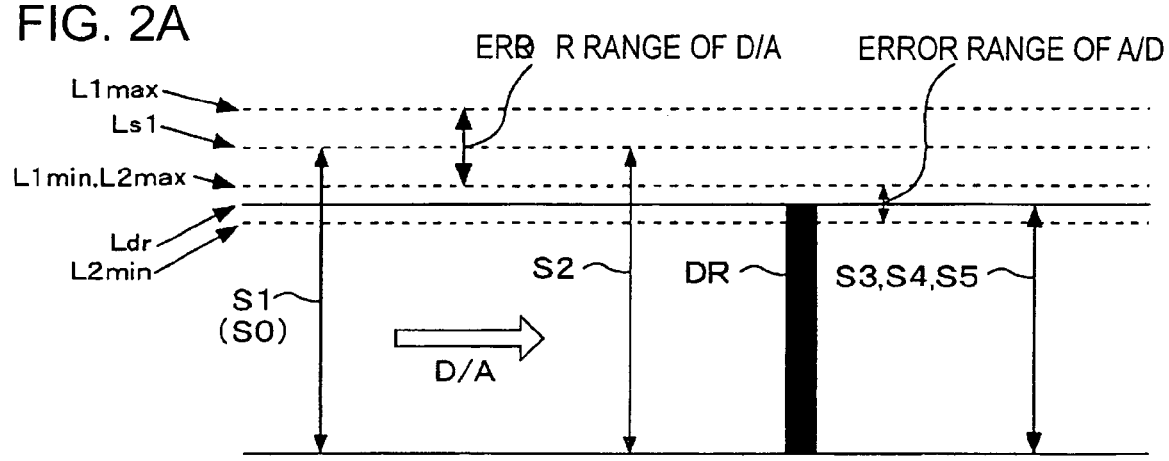
FIGS. 2A, 2B, and 2C are views schematically showing a procedure example for setting a gain as a first embodiment.

FIGS. 2A, B, and C schematically show a procedure as a first embodiment for setting the gains to the first and second GCA 13 and 24 in the embodiment.

As described above, the signals levels of the D/A converter 12 in the DSP 1 and the A/D converter 21 in the signal processing block 4 have dispersed errors. Further, the range of dispersion of the errors, that is, the maximum and minimum values of the errors of each device is previously determined in a specification. Further, the range of dispersion of the errors (maximum value/minimum value) can be variably set according to a constant of an element such as an eternal resistor and the like.

In the first embodiment, before the gains are adjusted actually, the relation between the range of dispersion of the errors of the D/A converter 12 and that of the A/D converter 21 is set as follows as a preparation step.

More specifically, first, as shown in FIG. 2A, the range of dispersion of the error of the D/A converter 12 can be shown by a maximum value L1max and a minimum value L1min. Further, the range of dispersion of the error of the A/D converter 21 is also shown by a maximum value L2max and a minimum value L2min. Then, as shown in FIG. 2A likewise, the minimum value of the D/A converter 12 is set equal to or larger than the maximum value L2max of the A/D converter 21 (or to a value equal to or larger than the maximum value L2max).

After the gain is set as described above, in the first embodiment, a data value, which corresponds to a level that is prescribed as a maximum signal level to be processed by the DSP 1, is set to the signal output from the signal processing unit 11, that is, to the signal S0 input to the first GCA 13 as a signal source for adjustment executed thereafter. In, for example, the first embodiment, a signal 100IRE, which corresponds to a so-called white level, is used as a signal of the level Ls1.

Further, in the gain adjustment executed thereafter, a gain of one time is set to the first and second GCAs 13 and 24 as an initial value.

In a state that the gain values G1, G2 of the first and second GCAs 13 and 24 are set to the initial value, first, since the signal S0 output from the signal processing unit 11 of the DSP 1 can be regarded as the same signal as the signal S1 input from the first GCA 13 to the A/D converter 21, the signal S1 also has the level Ls1 as shown in FIG. 2A. The level of the signal S2, which is obtained by converting the signal S1 into the analog signal by the D/A converter 12, is not made equal to or smaller than the maximum value L2max even if the amounts of dispersion of the errors of the input to and the output from the D/A converter 12 is minimized. This is because a minimum value, which can be employed by the signal S2, is the minimum value L1min of the range of dispersion of the error of the D/A converter 12.

That is, when the level of the signal S1 input to the D/A converter 12 is set to a maximum value allowed by the DSP 1, the signal S2 input to the A/D converter 21 securely overflows depending on the range of dispersion of errors set to the D/A converter 12 and the A/D converter 21 shown in FIG. 2A (however, this is based on the gain value of the first GCA 13 that is set to one time). When this is analyzed from an inverse standpoint of view, the signal S2 is set such that it is not made equal to or smaller than the actual allowable maximum input level of the A/D converter 21 when the input signal S1 is set to an allowable maximum value. That is, the output from the D/A converter 12 is prevented from being input to the A/D converter 21 in an insufficient range state.

When the range of the S2 is insufficient when it is input to the A/D converter 21, the insufficient range cannot be recovered even if a gain is increased by the second GCA 24 located behind the A/D converter 21. Although the signal S2 is converted into the digital video signal S3 by the A/D converter 21, the signal S3 includes a signal level error due to the dispersion of error of the A/D converter 21. The signal S3 is input to the second GCA 24 as the signal S4 through the signal processing unit 22. It is assumed here that no signal level is changed as a result of the digital signal processing executed by the signal processing unit 22. More specifically, it is assumed that the gain value of the signal processing unit 22 is one time. Further, since the gain value of the second GCA 24 is one time, it can be assumed that the signals S4 and S5 are the same signal. Accordingly, in this case, the signals S5 and S3 can be regarded as the same signal.

The signal S3 is a signal which is digitized by the A/D converter 21 and overflows. Accordingly, the signal S3 is set to a state that it is fixed to the maximum level (Ldr) of the dynamic range that is determined depending on the actual dispersion of errors of the A/D converter 21 within the range of dispersion of errors of the A/D converter 21 (between the maximum value L2max and the maximum value L2 min).

At the time, the signal S5 also has the same level as the signal S3. As shown in FIG. 1, the signal S5 is also input to the microcomputer 5. The microcomputer 5 executes control processing for gain adjustment executed thereafter based on the level (data value) of the signal S5.

In the initial state, the signal S5 is fixed to the level Ldr as described above, which means that a state that the signal overflows is created.

To adjust the gain by the microcomputer 5, first, the gain value G1 to be set to the first GCA 13 is reduced until the level of the signal S5 being input is reduced to a value equal to or less than level Ldr while monitoring the signal S5. Note that the gain value G1 is controlled by the microcomputer 5 which outputs a control signal for indicating the gain value G1. Further, to describe for the purpose of confirmation, the level Ls1, which is prescribed maximum, is kept to the signal S0 input to the first GCA 13 thereafter.

Figure 2B:
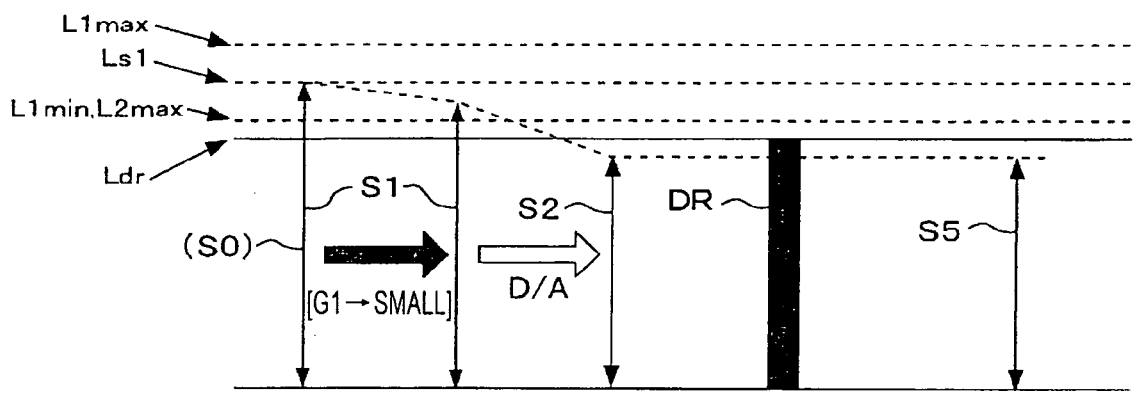

FIG. 2B shows how a gain value is set to the first GCA 13 described above.

More specifically, the level of the signal S1, which is output from the first GCA 13 and input to the D/A converter 12, is reduced by reducing the gain value of the first GCA 13 from the initial value. In correspondence to the reduction of the signal S1, the level of the signal S2, which is output from the D/A converter 12 and input to the A/D converter 21, is also reduced. However, in a state that the level of the signal S2 is larger than the level Ldr that is the maximum value of the dynamic range DR of the A/D converter 21, the signal S2 becomes an excessive input in the A/D converter 21 and overflows therein. At the time, it is detected that the signal S5 is fixed to the level Ldr.

As described above, since the signal S5 overflows as long as the level thereof is fixed to the level Ldr, the microcomputer 5 controls the first GCA 13 to reduce the gain value set thereto.

When the gain value is reduced as described above, the signal S5 (the signal S3 output from the A/D converter 21) is set to a value smaller than the level Ldr for the first time. At the time, the gain value set to the first GCA 13 is made to a gain value optimum to the first GCA 13. More specifically, a state that a maximum level to the dynamic range DR is input can be obtained within a range in which no overflow (saturation of level) occurs behind the first GCA 13. Thereafter, the gain value set to the first GCA 13 at the time is fixedly set to the first GCA 13.

After the gain value is set to the first GCA 13 as described above, a gain is set to the second GCA 24. Setting of the gain to the second GCA 24 begins from the state that the gain value has been set to the first GCA 13.

As described above, the sensitivity of the first GCA 13 is set higher than that of the second GCA 24, which means that, when the sensitivity is regarded as an amount of change of the output level of a signal in response to an amount of change of the same gain value having been set, the amount of change of the output level of the first GCA 13 is larger than that of the second GCA 24, in other words, which means that the resolution of the change of an output level in response to the change of the gain value is larger in the second GCA 24 than in the first GCA 13. That is, in the video signal processing system shown in FIG. 1, the first and second GCAs 13 and 24 undertake a separate role in that the former sets a rough adjustment gain and the latter sets a fine adjustment gain.

From what has been described above, in the state that the gain value of the first GCA 13 is set, the signal S5 is set to a level smaller than the maximum level Ldr of the dynamic range DR as shown in FIG. 2B. However, since the resolution when the gain is set to the first GCA 13 is low, the difference between the level of the signal S5 and the level Ldr may be relatively large.

However, the resolution when the gain of the second GCA 24 is set is relatively higher than that of the first GCA 13. Accordingly, it is possible to adjust the difference between the level of the signal S5 and the level Ldr as small as possible by making the level of the signal S5 near to the level Ldr by setting the gain to the second GCA 24. With this operation, a maximum input level can be made more near to the dynamic range DR within a range in which no overflow (saturation of level) occurs. That is, the dynamic range as a signal itself can be more improved. The gain of the second GCA 24 is set for this purpose.

When the gain is actually set to the second GCA 24, the microcomputer 5 controls the second GCA 24 to increase the gain value to be set to the second GCA 24 while monitoring the level of the signal S5. The gain value G2 is also set to the second GCA 24 by outputting a control signal for indicating the gain value G2 by the microcomputer 5.

Figure 2C:
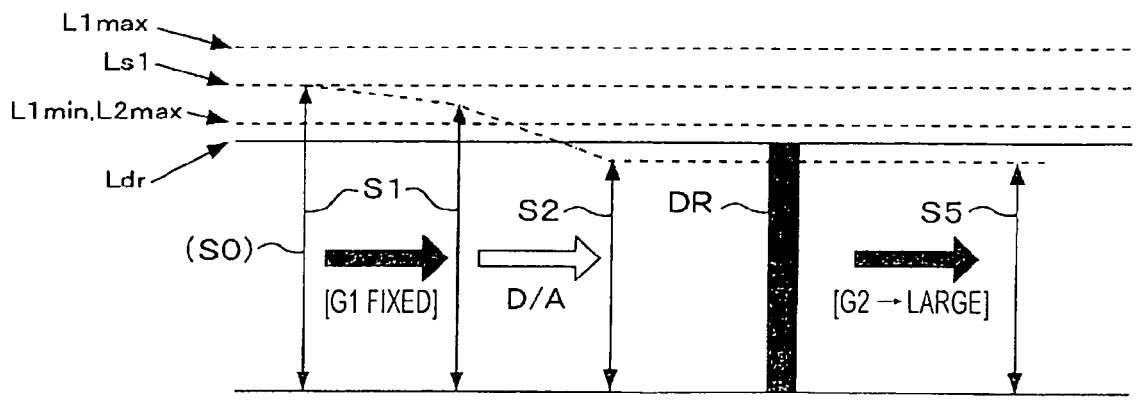

The gain is set to the second GCA 24 as shown in FIG. 2C.

The level of the signal S5 as the output from the second GCA 24 is increased in response to the gain value of the second GCA 24 set to a higher value as described above. To describe for the purpose of confirmation, since the resolution of the second GCA 24 to the change of output level thereof is higher than that of the first GCA 13, the amount of change of the level of the signal S5 at, for example, every one step is smaller than that of the first GCA 13.

Then, at a certain step, the signal S5 reaches a level that is regarded as the same level as the maximum level Ldr of the dynamic range DR as shown in FIG. 2C. This state corresponds to that in which a fine adjustment is completed to the gain set as described above, thereby a maximum dynamic range can be conceptually secured within the range of level in which no overflow occurs. However, actually, an overflow approximately occurs in the state that the level of the signal S5 perfectly agrees with the level Ldr, which is actually not preferable. To cope with this problem, in actual processing, the gain value of the second GCA 24 is set smaller than the state that the level of the signal S5 agrees with the level Ldr so that the level of the signal S5 is set smaller than the level Ldr by the gain value of the one step. Thereafter, the gain value set to the second GCA 24 as described above is fixedly set to the second GCA 24.

Figure 3:
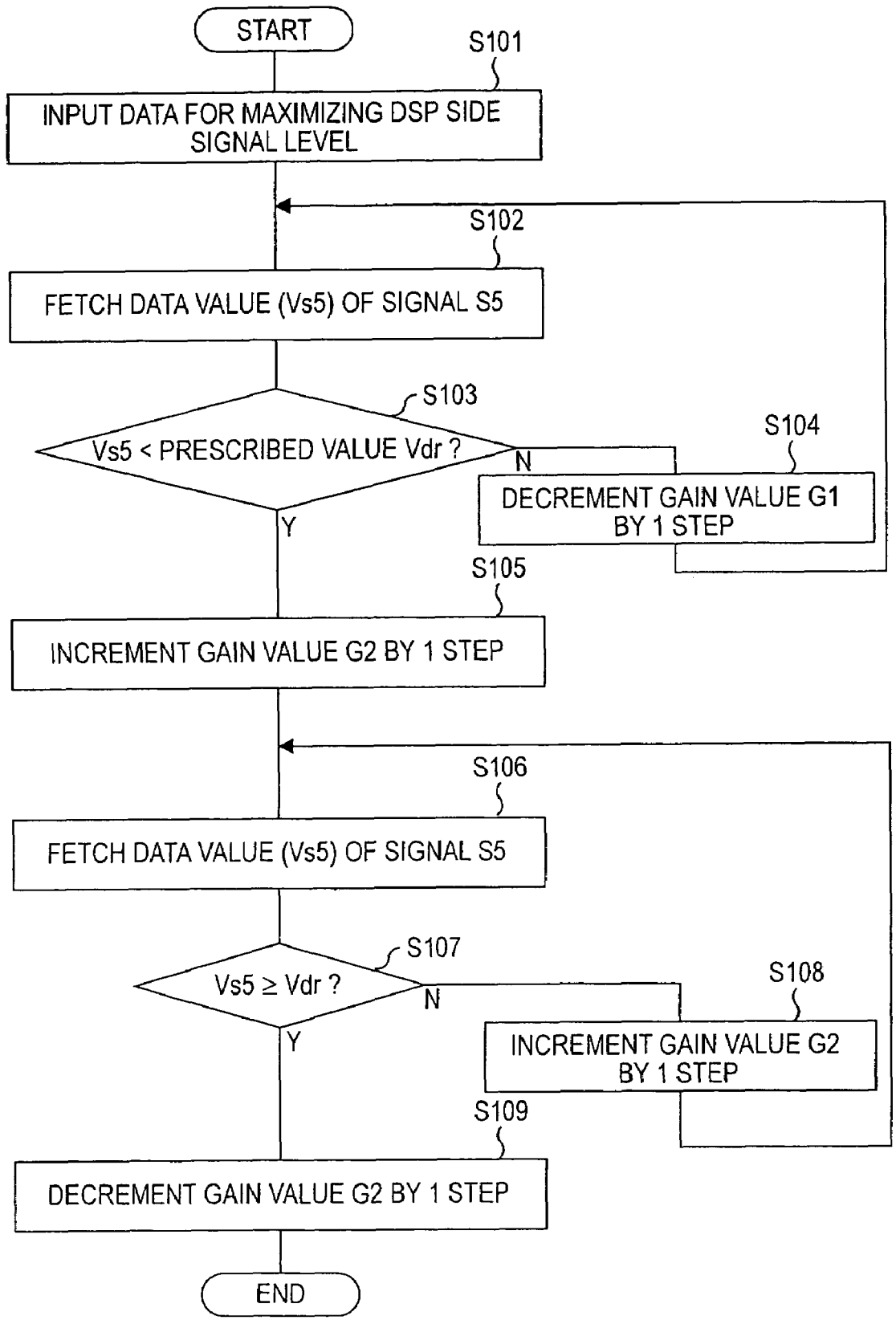
FIG. 3 is a flowchart showing a processing operation for setting the gain as the first embodiment.

A processing operation, which is executed by the microcomputer 5 (CPU) according to the gain setting procedure explained by FIGS. 2A, B, and C, is shown in a flowchart of FIG. 3. Note that when the processing shown in the figure is executed, the relation between the minimum value L1min within the range of dispersion of the errors of the D/A converter 12 and the maximum value L2max within the range of dispersion of the errors of the A/D converter 21 is already set. Further, the initial value (for example, the gain value corresponding to one time) is set to the gain values G1 and G2 of the first and second GCAs 13 and 24, respectively.

In the processing shown in the figure, first, data for maximizing the signal level on the DSP side is created as an input signal at step S101. More specifically, as an example, the signal processing unit 11 is controlled such that the signal S0, which is output from the signal processing unit 11 of the DSP 1 and input to the subsequent signal processing system is made to the digital video signal having the level 100IRE as described above. With this operation, the initial state explained with reference to FIG. 2A can be obtained. That is, in the system in which the signal S0 is processed and set to the signal S5, a state that a signal overflows (is set to an excessively large level) is securely obtained.

The microcomputer 5 captures the data value (level) VS5 of the signal S5 at next step S102. The level of the signal S5 is monitored by the processing.

At next step S103, it is determined whether or not VS5<Vdr is established as to the data value VS5 of the signal S5 captured at step S102 and a preset prescribed value Vdr.

As described with reference to FIGS. 2A, B and C, in the initial state, the level of the signal S5 is fixed to the maximum level Ldr of the dynamic range DR and is equal to the level Ldr. The prescribed value Vdr is fundamentally set to a data value corresponding to the level Ldr. Actually, however, the prescribed value Vdr may be set to an arbitrary predetermined value smaller than the level Ldr in consideration that an optimum dynamic range can be secured according to the specifications and the like of the chips and the devices of the DSP 1 and the like.

When the relation VS5<Vdr is not established at step S103, that is, when a negative result of determination is obtained because a relation of VS5≧Vdr is established, it can be said that a state of overflow still occurs.

To cope with this problem, the process goes to step S104 at which the gain value G1 to be set to the first GCA 13 is decremented by one step. As a result of the processing, the level of the signal S1 output from the first GCA 13 is reduced by an amount corresponding to the gain value decremented by the one step. On the completion of the processing at step S104, the process returns to step S102. As described in FIG. 2B, an operation for reducing the gain value to be set to the first GCA 13 until no overflow occurs in the signal can be obtained by the processing flow from step S102 to step S104 through step S103.

When it is assumed that an affirmative result of determination is obtained because the relation VS5<Vdr is established at step S103, the state that no overflow occurs can be obtained for the first time in the signal processing system from the D/A converter 12 to which the signal S1 is input to the second GCA 24 from which the signal S5 is output. That is, the gain value G1 is properly set to the first GCA 13. In this case, the process goes to processing for setting the gain to the second GCA 24 at step S105 and subsequent steps. Thereafter, the gain value G1 set to the first GCA 13 is not changed, thereby the gain value G1 of the first GCA 13 is fixedly set.

To set the gain to the second GCA 24, first, at step S105, the gain value G2 is incremented by one step. With this operation, the level of the signal S5 output from the second GCA 24 is increased in response to the gain value G2 increased by one step.

At next step S106, the data value VS5 of the signal S5 is captured likewise previous step S102. Then, at subsequent step S107, it is determined whether or not the relation VS5≧Vdr is established as to the data value VS5 and the prescribed value Vdr. When the relation VS5≧Vdr is not established and a negative result of determination is obtained because the data value VS5 is smaller than the prescribed value Vdr, the gain of the second GCA 24 can be set to a large value. In this case, the process goes to step S108, increments the gain value G2 by one step, and returns to the processing at step S106. In the flow of processing from step S106 to step S108 through step S107, the gain is finely adjusted so that a maximum dynamic range can be forcibly obtained.

When the affirmative result is obtained at step S107, it is assumed here for the first time that the signal S5 has reached the same level as the maximum level Ldr of the dynamic range DR. In this case, the process goes to processing at step S109.

At step S109, the gain value G2 is decremented by one step. As described above, the processing is executed to reduce the level of the signal S5 by the gain value of one step so that a state that any overflow does not securely occur can be obtained. On the completion of the processing at step S109, the gain setting processing shown in the figure is finished. With this operation the gain value of the second GCA 24 is also fixedly set to the final value thereafter.

Incidentally, what has been explained with reference to FIGS. 2A, 2B, and 2C is based on the gain (signal processing gain) that is given to the signal by the signal processing by the signal processing unit 22 in the signal processing block 4 is one time. Thus, the gain control in the signal processing system is equivalent to that in which the signal processing unit 22 is passed.

However, as a matter of fact, it is also possible depending on a type of signal processing that a gain is given to a signal after it is processed and thus the level of the signal itself changes. Accordingly, the signal processing unit 22 may employ an arrangement for executing signal processing for giving a gain to a signal.

Therefore, next, how a gain is set in the embodiment when a signal processing unit 22 is arranged to give a signal processing gain other than one time to a signal to be processed will be explained as a second embodiment.

Figure 4A:
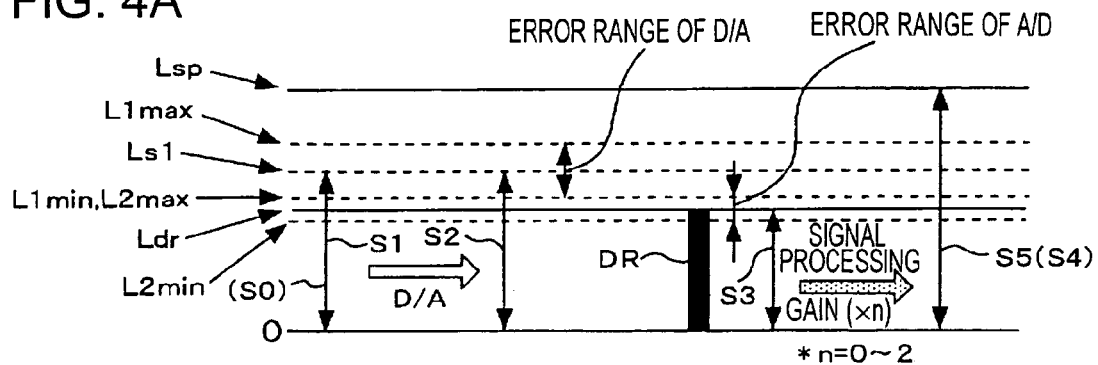
FIGS. 4A, 4B, 4C, and 4D are views schematically showing a procedure example for setting the gain as the first embodiment.
Figure 4B:
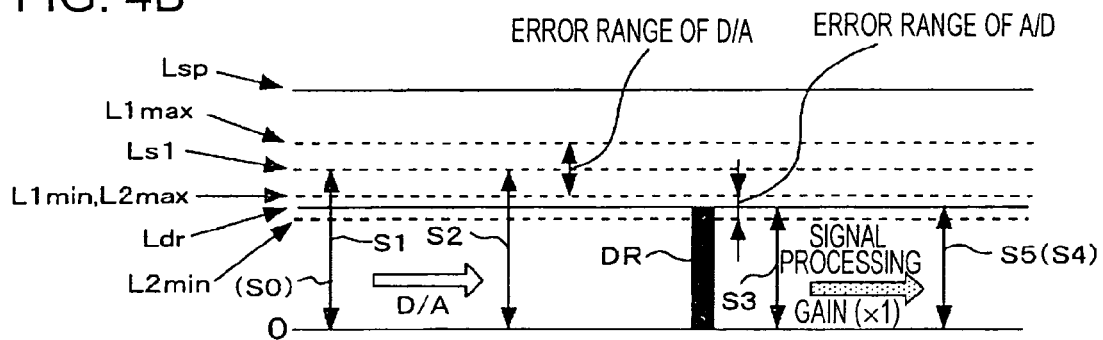
Figure 4C:
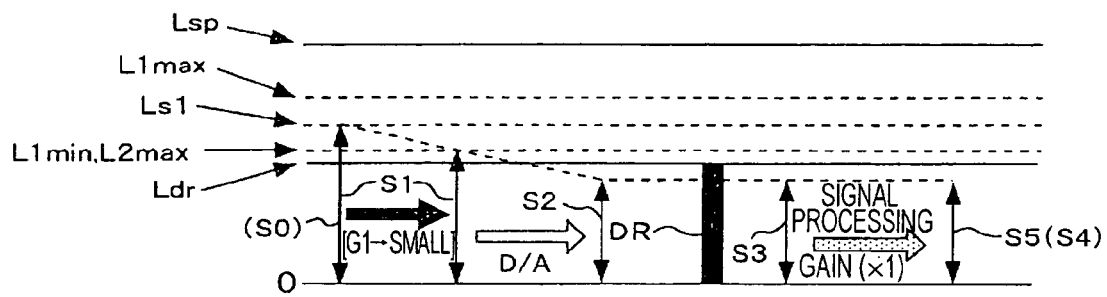

FIGS. 4A, 4B, and 4C show a procedure example for setting the gain as the second embodiment.

Also in this case, as the relation between the range of dispersion of the errors of a D/A converter 12 and that of an A/D converter 21, the minimum value L1min of the D/A converter 12 is set equal to or larger than the maximum value L2max of the A/D converter 21 or to a value larger than the maximum value L2max as a preparation step as shown in FIG. 4A.

Further, a data value corresponding to the level Ls1 (for example, 100IRE) that is prescribed maximum as a signal level treated by a DSP 1 is set to the signal S0 input to a first GCA 13 likewise. Further, a gain of one time is set to both the first GCA 13 and a second CA as an initial value. With this operation, a state that a signal securely overflows can be obtained in a state that the first GCA 13 and the second GCA initially have the gain of one time (equivalent to a passing-through state), respectively.

Further, it is assumed that the gain value (xn) of the signal processing gain in the signal processing unit 22 is set to n=0 to 2. In this case, a maximum gain value is set to 2 times. However, FIG. 4A shows a case that the gain value of the signal processing gain in the signal processing unit 22 is set to 2 times that where is a maximum value as a relation between the level of the S3 input to the signal processing unit 22 and that of the signal S4 output from the signal processing unit 22. In this case, it is shown that when the signal S3 is has the maximum level Ldr of the dynamic range DR, the signal S4 has a level Lsp that is twice the level Ldr. Further, in this case, since the gain value G2 of the second GCA 24 is set to a value corresponding to the one time of the initial value, the signal 5 output from the second GCA 24 has the same level as the signal S4.

Further, in this case, as an initial state, the gain value of the signal processing gain in the signal processing unit 22 is controlled to one time (n=1) as shown in FIG. 4B. When the gain of the first GCA 13 is to be set, the signal S4 input to the second GCA 24 must have the same level response as that of the signal S3 output from the A/D converter 21 likewise the previous embodiment. At the time, when the gain value in the signal processing gain of the signal processing unit 22 is a value other than the one time, the level response of the signal S4 is set to a level response different from that of the signal 3.

Thus, the signal S4 (S5) output from the signal processing unit 22 can be set to the same level as that of the signal S3 input to the signal processing unit 22 as shown in FIG. 4B by setting the gain value of the signal processing gain in the signal processing unit 22 to the one time. Note, at this time, since an overflow (excessive input) state occurs likewise the previous first embodiment, the signals S3, S4, and S5 are fixed to the level Ldr.

As described above, since the gain value of the signal processing gain of the signal processing unit 22 is set to the one time as described above, when the signal processing system shown in FIG. 1 is viewed in its entirety, the gain setting state is equivalent to the case explained above with reference to FIGS. 2A, 2B, and 2C.

In this state, the gain value G1 of the first GCA 13 is reduced from the initial value until the level of the signal S5 is made smaller than the level Ldr as shown in FIG. 4 while monitoring the level (data value) of the signal S5 by a microcomputer 5. That is, the gain is set to the first GCA 13 likewise the explanation made with reference to FIG. 2B in the previous first embodiment.

Subsequently, although a gain is set to the second GCA 24, the signal processing gain of the signal processing unit 22 located just in front of the second GCA 24 must be taken into consideration when the gain is set. This is because, in this case, the dynamic range of a D/A converter 23 in the same is set based on a maximum signal level when the signal processing gain of the signal processing unit 22 is set to a maximum value. Accordingly, the gain value of the second GCA 24 must be set such that the second GCA 24 can maximally make use of the dynamic range of the D/A converter 23.

Figure 4D:
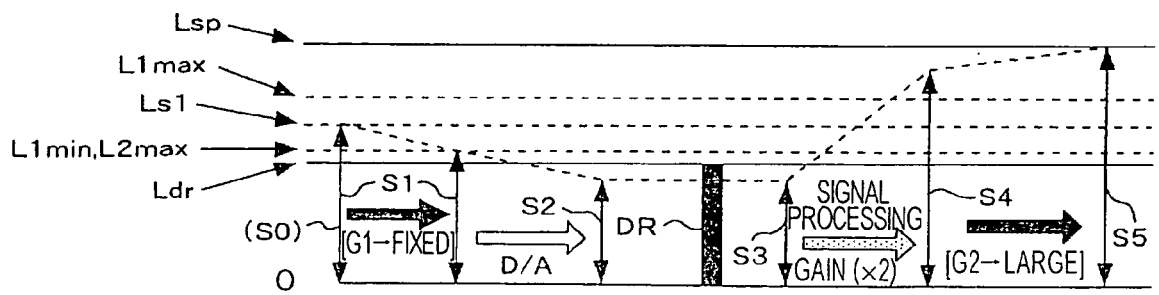

For this purpose, when the gain of the second GCA 24 is to be set, the signal processing gain of the signal processing unit 22 set to two times as shown in FIG. 4D. That is, it is set to a maximum value.

With this operation, the signal S4 output from the signal processing unit 22 has a level twice the signal S3 input to the signal processing unit 22. In this case, since the gain of the first GCA 13 is set, the level of the signal S3 has a value smaller than, for example, the maximum level (prescribed value) Ldr of the dynamic range DR. In response to the level of the signal S3, the level of the signal S4 has a value that is smaller than the level Lsp that is just twice the maximum level Ldr of the dynamic range DR although it is near to the level Lsp.

After the above state is achieved, the microcomputer 5 increases the gain value G2 set to the second GCA 24 until the level of the signal S5 is set equal to the level Lsp.

When the level of the signal S5 is set equal to the level Lsp, it can be said that a state, in which a maximum dynamic range can be secured, is achieved within the range of level in which no overflow occurs conceptually. In actual processing, however, the gain value of the second GCA 24 is set smaller than the state that the level of the signal S5 is set equal to level Ldr so that the level of the signal S5 is set smaller than the level Ldr by the gain value of the one step to thereby prevent overflow from occurring actually.

Figure 5:
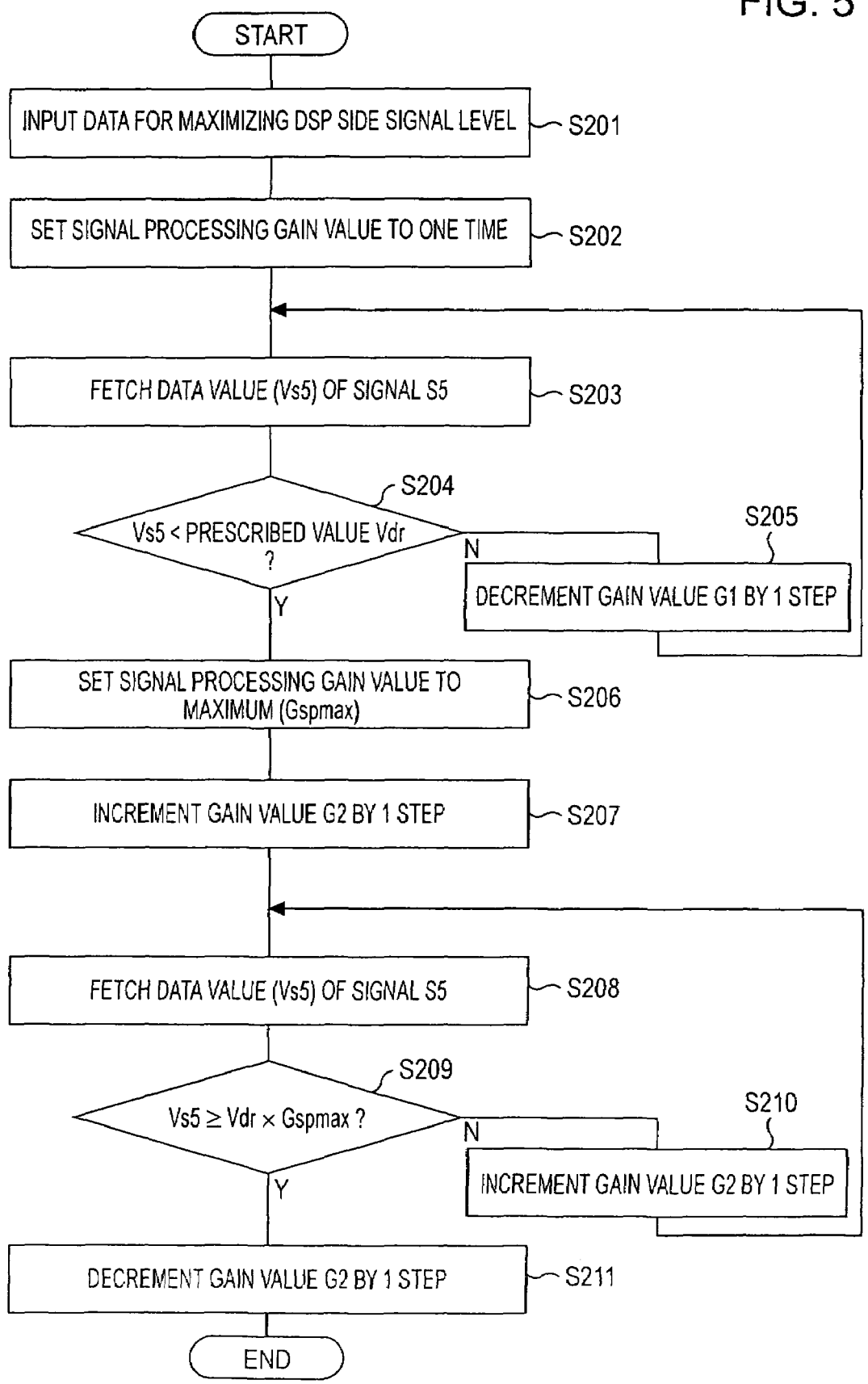
FIG. 5 is a flowchart showing a processing operation for setting the gain as the first embodiment.
Figure 6:
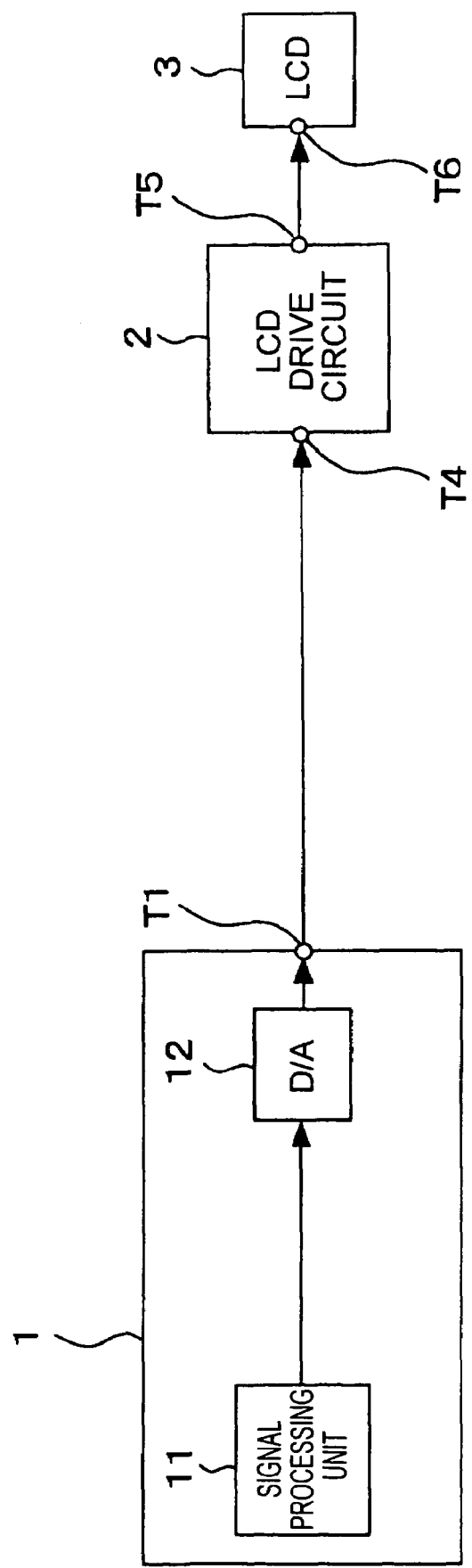
FIG. 6 is a block diagram showing a configuration example of an image display apparatus as conventional equipment provided with a DSP to execute video signal processing.
Figure 7:
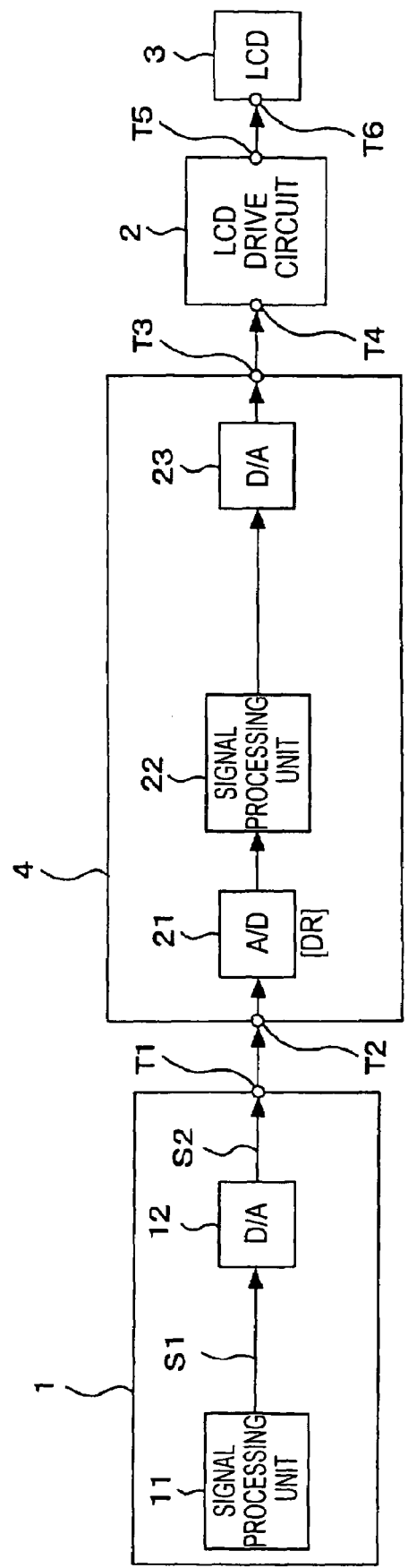
FIG. 7 is a block diagram showing an arrangement of the image display apparatus shown in FIG. 6 to which a signal processing block is newly added.
Figure 8A:
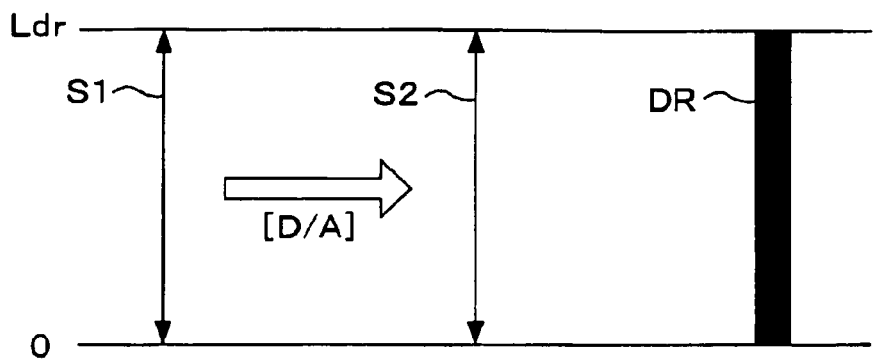
FIGS. 8A, B, and C are views explaining a phenomenon in which a dynamic range is deteriorated due to dispersion of error of the signals of cells of D/A converters and an A/D converter in the image display apparatus shown in FIG. 7.
Figure 8B:
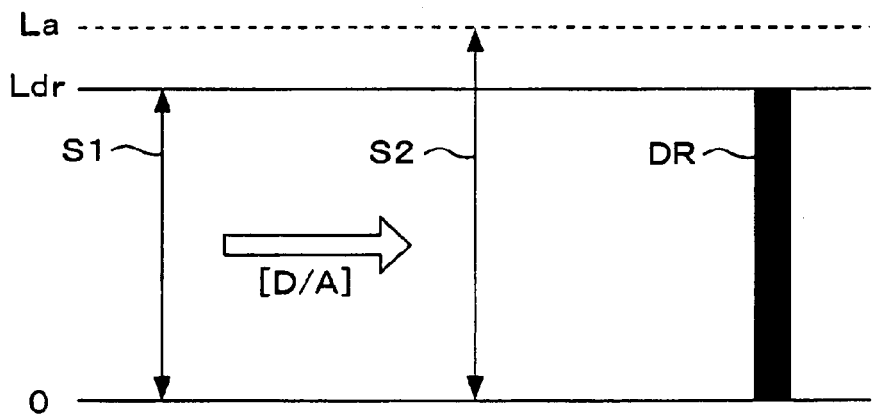
Figure 8C:
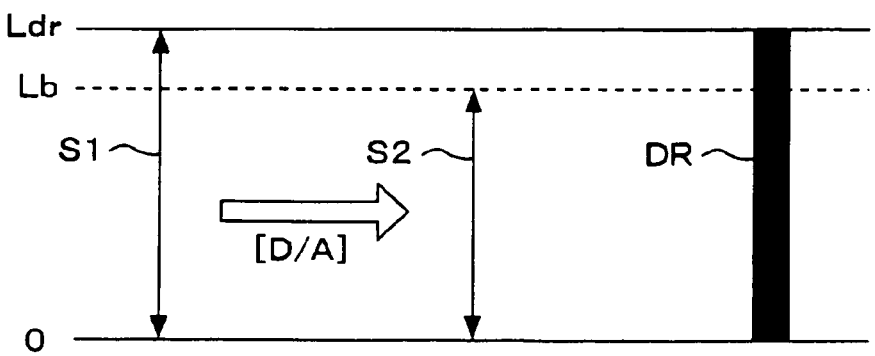

A flowchart of FIG. 5 shows a processing operation executed by the microcomputer 5 (CPU) according to the gain setting procedure explained with reference to FIGS. 4A, 4B, and 4C.

In the processings executed at S201 to S205 in the figure, the processings other than that executed at step S202 are the same as those executed at steps S101 to S104 of FIG. 3. As explained in FIG. 4B, the processing at step S202 is executed to set the level of the signal S4 (S5) equal to the signal S3 when the gain of the first GCA 13 is set.

When an affirmative result of determination is obtained at step S204, the process goes to a processing sequence for setting the gain of the second GCA 24 at step S206 and subsequent steps, at which the gain of the first GCA 13 is set.

At step S206, the gain value of the signal processing gain of the signal processing unit 22 is set to a maximum value Gspmax. When the gain value is treated here as a multiple number (n), which is used as the gain, as it is, Gspmax=2 is established in the examples of FIGS. 4A, B, C, and D.

Processings at steps S207 to S211 subsequent to step S206 are the same as the processings at steps S106 to S109 of FIG. 3 corresponding to the previous embodiment.

However, since the maximum value Gspmax is set as the gain value of the signal processing unit 22, whether or not the following formula is established is determined to determine the relation between the data value VS5 of the signal S5 and the prescribed value Vdr at step S209.

$$Vs5 \geq Vdr \times Gspmax$$

With this operation, the level of the signal S5 is set equal to the level Lsp (actually, the level is set smaller than the level Lsp by one step by the processing at step S210) as described in FIG. 4D. Note that FIG. 4D is an example of a case in which the data value corresponding to the level Ldr is set to the prescribed value Vdr. As described above, when the processings up to step S211 are executed, the gains of the first and second GCAs 13 and 24 are set.

It should be noted that the present invention is by no means limited to the arrangements of the embodiments explained up to now.

Further, the present invention can be also applied to a case in which a plurality of signal processing blocks are connected in parallel behind the DSP 1. That is, after the gain is set to the first GCA 13 once as described in the embodiment, the gain is sequentially set to the second GCA in each of the signal processing blocks connected in parallel in the rear stage.

Further, in, for example, the embodiment explained up to now, the example in which the one set of the signal processing block 4 is added to the DSP 1 as shown in FIG. 1. However, it is also contemplated to apply the present invention to an arrangement in which a signal processing block is further connected in series behind, for example, the DSP 1—the signal processing block 4.

Further, although the above embodiment exemplifies the image display apparatus as equipment including the signal processing device based on the present invention, a display device such as a plasma display, a cathode ray display tube, and the like may be employed as the image display apparatus, in addition to the LCD. Further, various types of devices such as image recording equipment, a DVD (digital versatile disc) player, and the like are known as equipment for executing digital video signal processing, and the present invention can be applied to the equipment.

Further, although the embodiment exemplifies to set the gain to the video signal, it can be also applied to an arrangement for executing the digital signal processing to signals having other formats such as an audio signal and the like.

INDUSTRIAL APPLICABILITY

As described above, the present invention overcomes a problem in that when signals of an analog signal format are input and output between two blocks for executing digital signal processing, a dynamic range is made improper by the dispersion of errors of the signal levels in a D/A converter and an A/D converter disposed in the blocks, thereby it is possible to provide, for example, a result of the reproduced output of a signal with excellent quality.

The invention claimed is:

1. A signal processing device, comprising a first digital signal processing block and a second digital signal processing block, wherein:

the first digital signal processing block comprises:

first gain adjustment means to which a digital signal subjected to predetermined digital signal processing is input and from which the digital signal is output after a gain according to a set gain value is given to the digital signal; and first digital to analog conversion means for converting the digital signal output from the first gain adjustment means to an analog signal and outputting the analog signal from the first digital signal processing block, the second digital signal processing block comprises:

analog to digital conversion means for converting the analog signal output from the digital to analog conversion means of the first digital signal processing block to a digital signal;

digital signal processing means for subjecting the digital signal output from the analog to digital conversion means to predetermined digital signal processing;

second gain adjustment means to which the digital signal output from the digital signal processing means is input, from which the digital signal is output after a gain according to a set gain value is given to the signal, and to which gain sensitivity lower than that of the first gain adjustment means is set; and second digital to analog conversion means for converting the digital signal output from the second gain adjustment means to an analog signal and outputting the analog signal from the second digital signal processing block, the first digital to analog conversion means and the analog to digital conversion means are set such that a relation, in which the minimum value within a range of dispersion of the errors of the signal level in the first digital to analog conversion means is equal to or larger than the maximum value within a range of dispersion of the errors of the signal level in the analog to digital conversion means, and the signal processing device further comprises:

detection means for detecting the level value of the digital signal output from the second gain adjustment means;

first gain set means for setting a gain value to the first gain adjustment means such that the level value detected by the detection means is set to a maximum value within a range less than a prescribed value in a state that a signal whose level is treated as a maximum value in the first digital signal processing block is input to the first gain adjustment means; and second gain set means for setting a gain value to the second gain adjustment means such that the level value detected by the detection means is set to a maximum value within a range equal to or less than the prescribed value in a state that a signal whose level is treated as a predetermined maximum value is input to the first digital signal processing block after the gain value is set by the first gain set means.

2. A signal processing device according to claim 1, wherein:

when the gain of the digital signal is changed, the first gain set means inputs a signal whose level is treated as the predetermined maximum value to the first digital signal processing means as well as the gain value is set to the first gain set means such that the level value detected by the detection means is set to a maximum value within the range less than the prescribed value in a state that the gain value is set to a maximum gain value in the digital signal processing means; and the second gain set means inputs a signal whose level is treated as a predetermined maximum value to the first digital signal processing block after a gain value is set by the first gain set means as well as sets a gain value to the second gain adjustment means such that the level value detected by the detection means is set to a maximum value within the range equal to or less than the prescribed value in a state that the gain value is set to one time in the digital signal processing means.

3. A signal processing method of executing first digital signal processing and second digital signal processing, wherein:

the first digital signal processing comprises:

a first gain adjustment procedure to which a digital signal subjected to predetermined digital signal processing is input and which gives a gain according to a set gain value; and a first digital to analog conversion procedure for converting the digital signal obtained by the first gain adjustment procedure to an analog signal and using the analog signal as an output from the first digital signal processing, the second digital signal processing comprises:

an analog to digital conversion procedure for converting the analog signal obtained by the digital to analog conversion procedure included in the first digital signal processing into a digital signal;

a digital signal processing procedure for subjecting the digital signal obtained by the analog to digital conversion procedure to predetermined digital signal processing;

a second gain adjustment procedure to which the digital signal obtained by the digital signal processing procedure is input and which gives a gain by gain sensitivity lower than the first gain adjustment procedure according to a set gain value; and a second digital to analog conversion procedure for converting the digital signal obtained by the first gain adjustment procedure to an analog signal and outputting the analog signal from the second digital signal processing unit, wherein the signal processing method further executes:

a set procedure for setting a such a relation that the minimum value within a range of dispersion of the errors of the signal level in a device corresponding to the first digital to analog conversion procedure is equal to or larger than the maximum value within a range of dispersion of the errors of the signal level in a device corresponding to the analog to digital conversion procedure;

a detection procedure for detecting the level value of the digital signal obtained by the second gain adjustment procedure;

a first gain set procedure for setting a gain value to the first gain adjustment procedure such that the level value detected by the detection procedure is set to a maximum value within a range less than a prescribed value in a state that a signal whose level is treated as a maximum value in the first digital signal processing is input to the first gain adjustment procedure; and a second gain set means for setting a gain value to the second gain adjustment procedure such that the level value detected by the detection procedure is set to a maximum value within a range equal to or less than the prescribed value in a state that a signal whose level is treated as a predetermined maximum value is input to the first digital signal processing block after the gain value is set by the first gain set procedure.

* * * * *